US008816424B2

(12) United States Patent
Lee et al.

(10) Patent No.: US 8,816,424 B2
(45) Date of Patent: Aug. 26, 2014

(54) NONVOLATILE MEMORY DEVICE

(71) Applicant: SK hynix Inc., Icheon-si (KR)

(72) Inventors: Ki-Hong Lee, Icheon-si (KR); Kwon Hong, Icheon-si (KR)

(73) Assignee: SK Hynix Inc., Icheon-Si, Gyeonggi-Do (KR)

( * ) Notice: Subject to any disclaimer, the term of this patent is extended or adjusted under 35 U.S.C. 154(b) by 0 days.

(21) Appl. No.: 14/075,901

(22) Filed: Nov. 8, 2013

(65) Prior Publication Data

US 2014/0061770 A1 Mar. 6, 2014

Related U.S. Application Data

(63) Continuation-in-part of application No. 12/493,820, filed on Jun. 29, 2009, now Pat. No. 8,604,537.

(30) Foreign Application Priority Data

Dec. 26, 2008 (KR) .................. 10-2008-0134788

(51) Int. Cl.
*H01L 29/792* (2006.01)
*H01L 29/788* (2006.01)
*H01L 29/423* (2006.01)

(52) U.S. Cl.
CPC .......... *H01L 29/792* (2013.01); *H01L 29/7881* (2013.01); *H01L 29/4234* (2013.01); *H01L 29/42324* (2013.01)
USPC .............. 257/324; 257/E21.21; 257/E29.309; 257/E21.209

(58) Field of Classification Search
CPC ................ H01L 29/792; H01L 27/115; H91L 27/11568
USPC .............. 257/324, E21.21, E29.309, E21.209
See application file for complete search history.

(56) References Cited

U.S. PATENT DOCUMENTS

| 7,098,504 B2 | 8/2006 | Kawashima et al. | |
|---|---|---|---|
| 2011/0198685 A1* | 8/2011 | Kim et al. | 257/324 |
| 2012/0068255 A1* | 3/2012 | Lee et al. | 257/324 |

FOREIGN PATENT DOCUMENTS

| KR | 1020020059746 | 7/2002 |
|---|---|---|
| KR | 100843229 | 6/2008 |

(Continued)

OTHER PUBLICATIONS

Chinese Office Action for 200910159486.2.

(Continued)

*Primary Examiner* — Timor Karimy
(74) *Attorney, Agent, or Firm* — Lowe Hauptman & Ham, LLP

(57) ABSTRACT

A non-volatile memory includes a channel layer to extend from a substrate in a vertical direction; a plurality of interlayer dielectric layers and a plurality of gate electrodes to be alternately stacked along the channel layer; and a memory layer to be interposed between the channel layer and each of the gate electrodes, wherein the memory layer comprises a tunnel dielectric layer to contact the channel layer, a first charge trap layer to contact the tunnel dielectric layer and formed of an insulating material, a charge storage layer to contact the first charge trap layer and formed of a semiconducting material or a conductive material, a second charge trap layer to contact the charge storage layer and formed of an insulating material, and a charge blocking layer to contact the second charge trap layer.

19 Claims, 10 Drawing Sheets

(56) References Cited

FOREIGN PATENT DOCUMENTS

| KR | 10855993 | 8/2008 |
| WO | 02/29902 | 4/2002 |

OTHER PUBLICATIONS

Korean Notice of Allowance for 10-2008-0134788.
Korean Office Action for 10-2008-0134788.

* cited by examiner 33  32C  32B  32A  31

NONVOLATILE MEMORY DEVICE

CROSS-REFERENCE TO RELATED APPLICATIONS

The present application is a continuation in part of U.S. patent application Ser. No. 12/493,820, filed Jun. 29, 2009, which is based on and claims priority to Korean Patent Application No. 10-2008-0134788, filed on Dec. 26, 2008. The disclosures of the above-listed applications are hereby incorporated by reference herein in their entirety.

FIELD

The present disclosure relates to a nonvolatile memory device and a method of fabricating the nonvolatile memory device.

BACKGROUND

The statements in this section merely provide background information related to the present disclosure and do not constitute prior art.

A memory device is classified into a volatile memory device and a nonvolatile memory device according to whether data is preserved or not when the power is cut off. The volatile memory device is a memory device, data of which is lost when the power is cut off, and its examples include a dynamic random access memory (DRAM) device and a static random access memory (SRAM) device. On the other hand, the nonvolatile memory device is a memory device, data of which is preserved even when the power is cut off, and a flash memory device is an example of the nonvolatile memory device.

Hereinafter, the nonvolatile memory device will be explained in detail with reference to a figure.

FIG. 1 is a cross-sectional view of a nonvolatile memory device including a known gate pattern.

Referring to FIG. 1, a tunnel dielectric layer 11 is formed on a substrate 10. Herein, the tunnel dielectric layer 11 is provided as an energy barrier for the tunneling of charges and includes an oxide layer.

Then, a charge capturing layer 12 is formed on the tunnel dielectric layer 11. The charge capturing layer 12 is provided as a practical data storage and its threshold voltage is changed by supplying or removing charges to or from the charge capturing layer 12. For instance, in a programming operation, charges of a bulk are supplied to the charge capturing layer 12 through the Fouler-Nordheim tunneling (F-N tunneling) and, in an erasing operation, charges captured in the charge capturing layer 12 are discharged into the bulk by the F-N tunneling, so that the threshold voltage is changed.

Subsequently, a charge blocking layer 13 is formed on the charge capturing layer 12. The charge blocking layer 13 plays a role of preventing the charges from passing through the charge capturing layer 12 and moving into a gate electrode 14.

After forming a conducting layer for a gate electrode 14 on the charge blocking layer 13, the conducting layer 14, the charge blocking layer 13 and the charge capturing layer 12 are sequentially etched. As a result, there is formed a gate pattern including the charge capturing layer 12, the charge blocking layer 13 and the conducting layer 14 that are patterned.

Meanwhile, the nonvolatile memory device is classified into a charge storage type nonvolatile memory device and a charge trap type nonvolatile memory device according to a data storage scheme. The charge storage type nonvolatile memory device includes a charge capturing layer formed with a charge storage layer and the charge trap type nonvolatile memory device includes a charge capturing layer formed with a charge trap layer.

Hereinafter, there will be described an energy band diagram in an erasing operation of each of the charge storage type nonvolatile memory device and the charge trap type nonvolatile memory device.

FIG. 2A is an energy band diagram of a known charge storage type nonvolatile memory device.

As shown in FIG. 2A, the charge storage type nonvolatile memory device stores data by storing charges in a conduction band of a charge storage layer and erases data by discharging charges stored in the charge storage layer into the bulk through the F-N tunneling by supplying an erasing voltage to the bulk.

Herein, the data erasing operation by the F-N tunneling is influenced by a potential barrier $\Phi_1$ of the interface between a charge storage layer 12A and a tunnel dielectric layer 11, a thickness W1 of the potential barrier profile, and a voltage drop $-V_1$ of the tunnel dielectric layer 11 that is generated when the erasing voltage is supplied.

If the erasing voltage is supplied to the bulk, the voltage drop $-V_1$ occurs at an interface between a substrate 10 and the tunnel dielectric layer 11 and thus a triangular potential barrier region A is formed. Since the thickness W1 of the potential barrier is relatively small in the triangular potential barrier region A, the charges stored in the charge storage layer 12A are discharged into the substrate 10 by the F-N tunneling, if the voltage drop $-V_1$ has a greater value than the potential barrier $\Phi_1$. Therefore, the charge storage type nonvolatile memory device has a high programming/erasing speed due to the F-N tunneling.

However, because the charge storage type nonvolatile memory device stores the charges in the conduction band, the inventor(s) has noted that it is prone to interference that is caused by neighboring memory cells. In particular, the inventor(s) has experienced that since the interference effect caused by neighboring memory cells increases as an interval between memory cells is reduced, the known charge storage type nonvolatile memory device has a limitation in enhancing the degree of integration of memory devices.

FIG. 2B illustrates an energy band diagram of a known charge trap type nonvolatile memory device.

As shown in FIG. 2B, the charge trap type nonvolatile memory device stores data by trapping charges in a deep level trap site in a charge trap layer 12B. The inventor(s) has noted that, herein, the deep level trap site is generally located in a deeper level than a conduction band (e.g., between the conduction band energy level Ec and the valence band energy level Ev), and the energy level of the trap site can be adjusted by changing the composition of the charge trap layer 12B.

As described above, the inventor(s) has noted that since the charge trap type nonvolatile memory device traps the charges in the trap site of the charge trap layer 12B, its interference effect caused by neighboring cells becomes less than that of the charge storage type nonvolatile memory device. The inventor(s) has, therefore, noted that the charge trap type nonvolatile memory device is more appropriate for enhancing the degree of integration of the memory devices than the charge storage type nonvolatile memory device.

However, since the charge trap type nonvolatile memory device performs an erasing operation by de-trapping (①) the charges trapped in the deep level trap site to the conduction band and then discharging the de-trapped charges to the bulk through the F-N tunneling (②), inventor(s) has noted that it requires a relatively high erasing voltage in the erasing operation. That is, the charge trap type nonvolatile memory device has a lower erasing speed than the charge storage type nonvolatile memory device.

The inventor(s) has noted that it is certainly possible to consider a scheme of improving the erasing speed by adjusting the composition ratio of the charge trap layer 12B. However, since the data preserving characteristic and the data erasing speed of the charge trap type nonvolatile memory device establish a trade-off relationship, the inventor(s) has noted that the data preserving characteristic is deteriorated when increasing the data erasing speed. For instance, in the case that the charge trap layer 12B is formed with a silicon nitride layer, if a percentage of silicon is increased, the erasing speed can be increased while the data preserving characteristic is deteriorated.

Thus, in order to overcome the characteristic deterioration of the memory device due to the interference effect and to further improve the degree of integration of the memory device, the inventor(s) has experienced that there is a need for a charge trap type nonvolatile memory device having a high data erasing speed and an excellent data preserving characteristic, and a method of fabricating the same.

SUMMARY

Embodiments disclosed in the present application are directed to provide a charge trap type nonvolatile memory device and a method of fabricating the same, which are appropriate for increasing a data erasing speed without deteriorating a data preserving characteristic.

In accordance with yet another embodiment, there is provided a nonvolatile memory device comprising: a channel layer, a plurality of interlayer dielectric layers and a plurality of gate electrodes, and a memory layer. The channel layer extends from a substrate in a vertical direction. The plurality of interlayer dielectric layers and a plurality of gate electrodes are alternately stacked along the channel layer. And the memory layer is interposed between the channel layer and each of the gate electrodes. The memory layer further comprises: a tunnel dielectric layer contacting the channel layer, a first charge trap layer contacting the tunnel dielectric layer and formed of an insulating material, a charge storage layer contacting the first charge trap layer and formed of a semiconducting material or a conductive material, a second charge trap layer contacting the charge storage layer and formed of an insulating material, and a charge blocking layer contacting the second charge trap layer.

DESCRIPTION OF EMBODIMENTS

Figure 1:
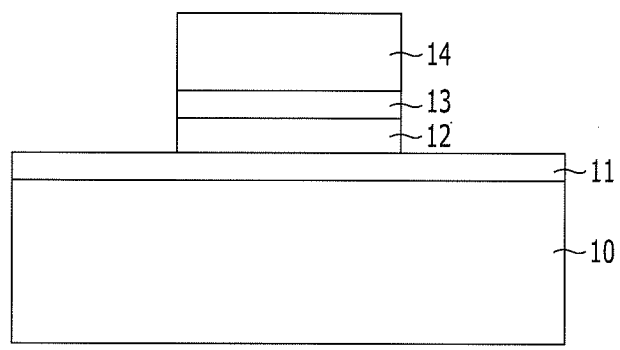
FIG. 1 is a cross-sectional view of a nonvolatile memory device including a known gate pattern.
Figure 2A:
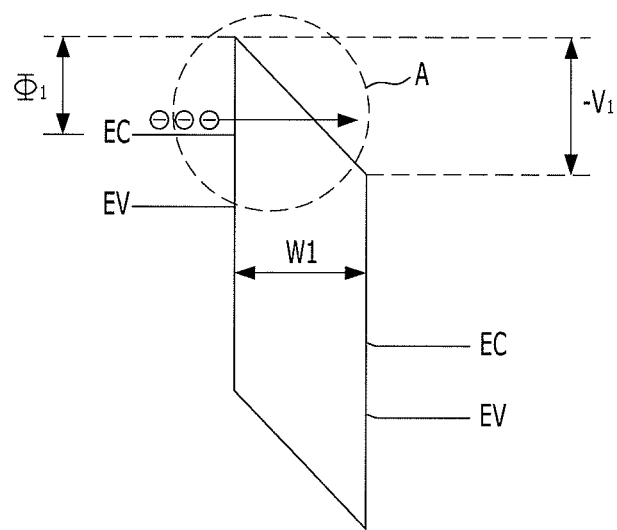
FIG. 2A is an energy band diagram of a known charge storage type nonvolatile memory device.
Figure 2B:
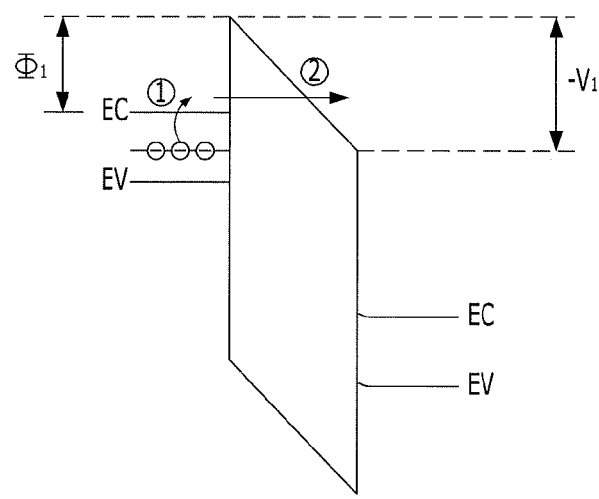
FIG. 2B is an energy band diagram of a known charge trap type nonvolatile memory device.

Other objects and advantages of the present disclosure can be understood by the following description, and become apparent with reference to one or more embodiments of the present application. In the figures, the dimensions of layers and regions are exaggerated for clarity of illustration. Like reference numerals refer to like elements throughout. It will also be understood that when a layer, a film, a region or a plate is referred to as being 'on' another one, it can be directly on the other one, or one or more intervening layers, films, regions or plates are also be present.

Further, although this description explains a charge capturing layer including a charge storage layer and a charge trap layer alternately stacked with each other and a charge capturing layer including a charge storage layer and a charge trap layer surrounding the charge storage layer, it is only for the simplicity of explanation and thus embodiments not limited thereto. One or more embodiments include charge capturing layers of various structures formed by combining a charge storage layer and a charge trap layer and methods of forming the same.

Figure 3:
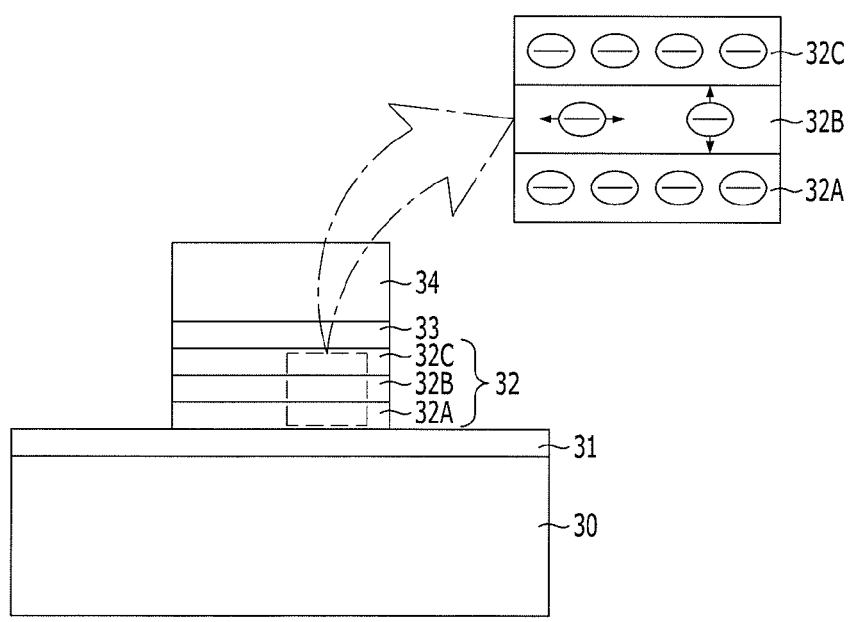
FIG. 3 is a cross-sectional view of a nonvolatile memory device including a gate pattern in accordance with at least one embodiment.

FIG. 3 illustrates a cross-sectional view of a nonvolatile memory device including a gate pattern in accordance with one embodiment. Hereinafter, a method of forming a charge capturing layer 32 by alternately stacking a charge storage layer and a charge trap layer, specially, a method of fabricating a nonvolatile memory device including the charge capturing layer 32 formed with a first charge trap layer 32A, a charge storage layer 32B and a second charge trap layer 32C will be described.

Referring to FIG. 3, a tunnel dielectric layer 31 is formed over a substrate 30. Herein, the tunnel dielectric layer 31 is provided as an energy barrier for charge tunneling and includes an oxide layer. Further, the process of forming the tunnel dielectric layer 31 includes a thermal oxidation process or a radical oxidation process. The tunnel dielectric layer 31 has a thickness of approximately 30 Å to approximately 80 Å.

Subsequently, the charge capturing layer 32 including the charge storage layer 32B and the charge trap layers 32A and 32C is formed on the tunnel dielectric layer 31. In this regard, according to one or more embodiments, the charge capturing layer 32 has the charge storage layer and the charge trap layer alternately stacked with each other. For instance, the charge capturing layer 32 includes a multi-layer formed by repeatedly and alternately stacking the charge storage layer and the charge trap layer such as a multi-layer of charge trap layer/charge storage layer/charge trap layer/charge storage layer/charge trap layer and a multi-layer of charge storage layer/charge trap layer/charge storage layer/charge trap layer. In accordance with one or more embodiments, the uppermost layer of the charge capturing layer 32 is the charge trap layer. Hereinafter, the process of forming the charge capturing layer 32 will be described in more detail.

First of all, the first charge trap layer 32A is formed on the tunnel dielectric layer 31. The first charge trap layer 32A includes one of a silicon nitride layer, an aluminum oxide layer, a zirconium oxide layer, a hafnium oxide layer, a lanthanum oxide layer, a niobium oxide layer and a combination thereof. The first charge trap layer 32A has a thickness of approximately 10 Å to approximately 50 Å.

For example, the first charge trap layer 32A is formed of a silicon nitride layer at a temperature of approximately 400° C. to approximately 800° C. using a $SiH_4$ gas or a $SiCl_2H_2$ gas, and a $NH_3$ gas through a chemical vapor deposition (CVD) method. Further, the silicon nitride layer is formed to have a composition ratio of 0.6<N/Si<1.45. That is, the ratio of N to Si is in a range of approximately 0.6 to approximately 1.45.

Then, the charge storage layer 32B is formed on the first charge trap layer 32A. Herein, the charge storage layer 32B includes one of a polysilicon layer, a germanium layer, a silicon germanium layer and a combination thereof, wherein the silicon germanium layer is a $Si_xGe_{1-x}$ layer having 0<x<1. Particularly, according to one or more embodiments, the charge storage layer 32B is formed of a semiconducting material layer the band gap size of which is smaller than those of the charge trap layers 32A and 32C, or a conductive material layer made by doping a semiconducting material layer with p-type impurities or n-type impurities.

The charge storage layer 32B has a thickness of approximately 10 Å to approximately 50 Å. More specifically, it has a thickness of approximately 20 Å to approximately 30 Å.

For instance, the charge storage layer 32B is formed of a polysilicon layer at a temperature of approximately 400° C. to approximately 800° C. using a $SiH_4$ gas, a $SiCl_2H_2$ gas or a $Si_3H_8$ gas through the CVD method. Moreover, the polysilicon layer is doped with n-type impurities such as P, As and Sb or p-type impurities such as B, Al, Ga and In and the doping concentration is in a range of approximately $10^{18}$ atoms/cm3 to approximately $10^{21}$ atoms/cm$^3$.

After then, the second charge trap layer 32C is formed on the charge storage layer 32B. Herein, the second charge trap layer 32C includes one of a silicon nitride layer, an aluminum oxide layer, a zirconium oxide layer, a hafnium oxide layer, a lanthanum oxide layer, a niobium oxide layer and a combination thereof. The second charge trap layer 32C has a thickness of approximately 10 Å to approximately 50 Å.

For instance, the second charge trap layer 32C is formed of a silicon nitride layer at a temperature of approximately 400° C. to approximately 800° C. using a $SiH_4$ gas or a $SiCl_2H_2$ gas, and a $NH_3$ gas through the CVD method. Further, the silicon nitride layer is formed to have a composition ratio of 0.6<N/Si<1.45. That is, a ratio of N to Si is in a range of approximately 0.6 to approximately 1.45.

As a result of the above processes, there is formed the charge capturing layer 32 including the first charge trap layer 32A, the charge storage layer 32B and the charge trap layer 32C that are sequentially stacked with each other. The charge capturing layer 32 has a thickness of approximately 50 Å to approximately 150 Å. Based on the charge capturing layer as described, it is possible to increase a data erasing speed without deteriorating a data preserving characteristic.

Subsequently, a charge blocking layer 33 is formed on the charge capturing layer 32. The charge blocking layer 33 plays a role of preventing charges from passing through the charge capturing layer 32 and moving into a gate electrode 34.

The charge blocking layer 33 is formed with a high-k material such as $Al_2O_3$, HfAlO, LaAlO, DyScO, GdScO, AlZrO and $ZrO_2$. In particular, the charge blocking layer 33 is formed with one of an aluminum oxide layer and a silicon oxide layer, or a stacked structure thereof. Further, the charge blocking layer 33 is formed using a CVD method or a sputtering method. The charge blocking layer 33 has a thickness of approximately 80 Å to approximately 150 Å.

Then, a conducting layer for the gate electrode 34 is formed on the charge blocking layer 33. The conducting layer 34 includes one of a doped polysilicon layer, a tungsten silicide layer, a titanium nitride layer, a tantalum nitride layer, a tungsten nitride layer and a stacked structure thereof.

The conducting layer 34, the charge blocking layer 33 and the charge capturing layer 32 are sequentially etched. Thus, there is formed the gate pattern including the charge capturing layer 32, the charge blocking layer 33 and the conducting layer 34 that are patterned.

Hereinafter, the structure of the charge capturing layer 32 will be described in more detail. As enlarged in FIG. 3, the charge capturing layer 32 includes a stacked structure of the charge storage layer 32B and the charge trap layers 32A and 32C.

Since it has the above structure, the charge capturing layer 32 can store data by trapping charges as well as by storing them. That is, in the charge storage layer 32B, the charges are stored in a conduction band and, in the charge trap layers 32A and 32C, the charges are trapped in a deep level trap site, so that the data are stored.

As such, in the case of forming the charge capturing layer 32 by combining the charge storage layer 32B and the charge trap layers 32A and 32C, it is possible to reduce the thicknesses of the charge trap layers 32A and 32C compared to the prior art and thus to discharge the charges trapped in the deep level trap site of the charge trap layers 32A and 32C to the bulk through the direct tunneling. Accordingly, it is not required to perform a de-trapping process and thus it is possible to reduce an erasing voltage compared to the prior art. In particular, since the charge storage layer 32B functions as a bridge for the charge movement, a charge trap type nonvolatile memory device according to one or more embodiments can have an erasing speed higher than that of a known charge trap type nonvolatile memory device.

Moreover, since the movement of the charges stored in the charge storage layer 32B is restricted by the increase of a potential barrier due to the charges trapped in the charge trap layers 32A and 32C, the data preserving characteristic of a charge trap type nonvolatile memory device according to one or more embodiments is not deteriorated although it partially includes the charge storage layer 32B. Also, since the interference effect caused by neighboring cells is blocked by the charges stored in the charge trap layers 32A and 32C surrounding the charge storage layer 32B, a charge trap type nonvolatile memory device according to one or more embodiments is almost not affected by the interference effect like a known charge trap type nonvolatile memory device although the charge trap type nonvolatile memory device partially includes the charge storage layer 32B.

Consequently, it is possible to provide the charge trap type nonvolatile memory device the data erasing speed of which is increased without the deterioration of the data preserving characteristic by forming the charge capturing layer 32 including the combination of the charge storage layer 32B and the charge trap layers 32A and 32C.

Figure 4A:
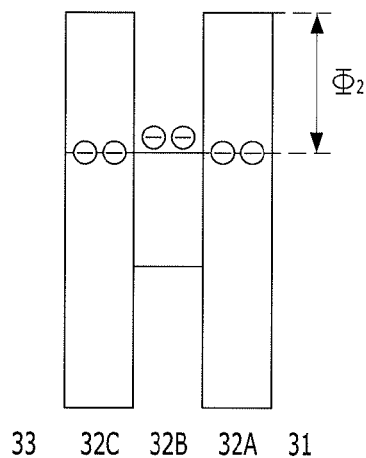
FIGS. 4A and 4B are energy band diagrams of a charge capturing layer in accordance with at least one embodiment.
Figure 4B:
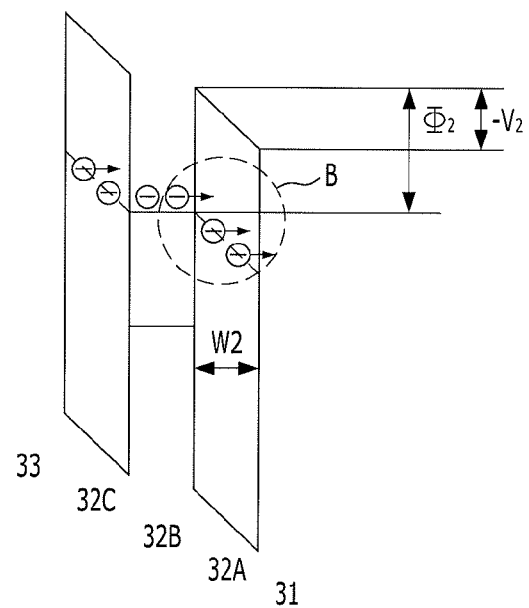

FIGS. 4A and 4B illustrate energy band diagrams of the charge capturing layer 32 in accordance with one embodiment. Hereinafter, data programming and erasing operations of the nonvolatile memory device including the charge capturing layer 32 formed with the combination of the charge storage layer 32B and the charge trap layers 32A and 32C will be described with reference to the energy band diagrams.

FIG. 4A illustrates an energy band diagram of the charge capturing layer 32 where charges are supplied in a programming operation.

As shown in FIG. 4A, when capturing the charges in the charge capturing layer 32 by supplying a programming voltage to the gate electrode 34, the charges are stored in the conduction band of the charge storage layer 32B, and are also trapped in the deep level trap site of the charge trap layers 32A and 32C.

Herein, an energy level of the trap site can be adjusted by the composition ratio of the charge trap layer. For instance, in the case that the charge trap layers 32A and 32C are formed with a silicon nitride layer and the charge storage layer 32B is formed with a polysilicon layer, the charge storage layer 32B can be formed to have the conduction band the energy level of which is substantially the same as that of the trap site of the charge trap layers 32A and 32C.

At this time, since the potential barrier $\Phi_{ox}$ of the interface between the charge storage layer 32B and the charge trap layers 32A and 32C is increased by the charges trapped in the charge trap layers 32A and 32C, it is possible to prevent the loss of the charges stored in the charge storage layer 32B due to the vertical or horizontal movement of the charges. That is, although a charge trap type nonvolatile memory device according to one or more embodiments partially includes the charge storage layer 32B, its data preserving characteristic is not deteriorated compared to a known charge trap type nonvolatile memory device.

For instance, in the case of forming the charge capturing layer 32 by combining the charge trap layers 32A and 32C made of a silicon nitride layer and the charge storage layer 32B made of a polysilicon layer, it is noted that the potential barrier $\Phi_{ox}$ of the interface between the charge storage layer 32B and the charge trap layers 32A and 32C has approximately 2.4 eV and thus the data preserving characteristic is not deteriorated.

FIG. 4B illustrates an energy band diagram of the charge capturing layer 32 in an erasing operation. As shown in FIG. 4B, if the erasing voltage is supplied to the bulk, a voltage drop $-V_2$ occurs at the interface between the first charge trap layer 32A and the tunnel dielectric layer 31.

At this time, since the first charge trap layer 32A is formed to have a smaller thickness than the charge trap layer of a known charge trap type nonvolatile memory device, the thickness of the potential barrier profile at the first charge trap layer 32A is relatively small. Further, the charge storage layer 32B has the conduction band the energy level of which is substantially the same as that of the trap site of the charge trap layers 32A and 32C and the charge storage layer 32B functions as a bridge in the erasing operation.

Therefore, although the voltage drop $-V_2$ is smaller than the potential barrier $\Phi_2$, the charges trapped in the first charge trap layer 32A are discharged into the substrate 30 in a trapezoidal potential barrier region B by the direct tunneling. Namely, when the erasing voltage is supplied, the charges trapped in the second charge trap layer 32C are directly tunneled to the charge storage layer 32B, and the charges stored in the charge storage layer 32B and the charges trapped in the first charge trap layer 32A are directly tunneled to the substrate 30. As a result, the erasing speed of the charge trap type nonvolatile memory device according to one or more embodiments can be increased compared to a known charge trap type nonvolatile memory device.

Figure 5:
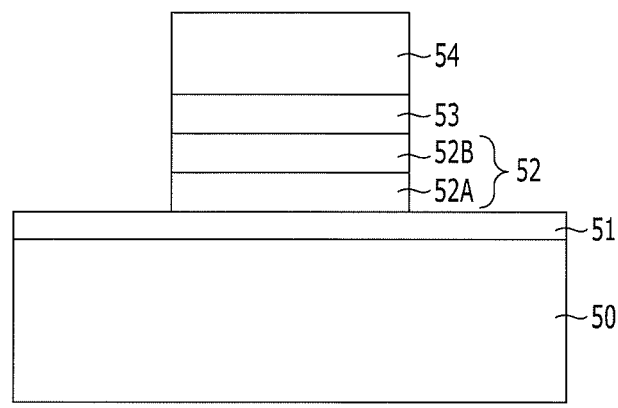
FIG. 5 is a cross-sectional view of a nonvolatile memory device including a gate pattern in accordance with another embodiment.

FIG. 5 illustrates a cross-sectional view of a nonvolatile memory device including a gate pattern in accordance with another embodiment. Hereinafter, a process of forming a charge capturing layer 52 by alternately stacking a charge storage layer and a charge trap layer and, particularly, a process of forming the charge capturing layer 52 including a charge storage layer 52A and a charge trap layer 52B will be described. The detailed description of the process is the same as that of FIG. 3.

Referring to FIG. 5, a tunnel dielectric layer 51 is formed over a substrate 50. Herein, the tunnel dielectric layer 51 is formed to have a greater thickness than the prior art. More specifically, the tunnel dielectric layer 51 has a thickness of approximately 40 Å to approximately 80 Å. As a result, it is possible to prevent charges stored in the charge storage layer 52A from being lost through the tunnel dielectric layer 51.

Then, after forming the charge storage layer 52A on the tunnel dielectric layer 51, the charge trap layer 52B is formed on the charge storage layer 52A, so that the charge capturing layer 52 is formed. At this time, the charge capturing layer 52 is formed to have a thickness ratio of the charge trap layer 52B to the charge storage layer 52A that is in a range of approximately 1 to approximately 3. The thickness ratio being 3 means that the thickness of the charge storage layer 52A to that of the charge trap layer 52B is 1:3.

Herein, the charge storage layer 52A is formed by performing a chemical vapor deposition process, but the charge storage layer 52A is formed of a polysilicon layer acquired by performing a crystallization and oxidization of an amorphous silicon layer. Hereinafter, the crystallization and oxidization of an amorphous silicon layer will be described.

An amorphous silicon layer is formed to have a certain thickness over the tunnel dielectric layer 51. For instance, the amorphous silicon layer is formed to have a thickness ranging from approximately 50 Å to approximately 100 Å.

The amorphous silicon layer is formed at a temperature ranging from approximately 480° C. to approximately 550° C. using silane ($SiH_4$) gas or disilane ($Si_2H_6$) gas in a high-temperature low-pressure batch type furnace. Otherwise, an amorphous silicon layer, not doped with impurities, is formed using a single wafer type chamber, or an amorphous silicon layer, doped with impurities, is formed using phosphine ($PH_3$) gas. At this time, the rate of charge storage and erasure of the memory device is controlled by controlling the impurity doping concentration level.

The amorphous silicon layer is crystallized and oxidized using an oxidation process. The amorphous silicon layer is crystallized to form a polysilicon layer and, at substantially the same time, is oxidized to form an oxide layer. The upper portion is oxidized without oxidizing the bottom portion by controlling the oxidation process. As a result, a thin layer structure which includes the non-oxidized remaining polysilicon thin layer in the bottom portion and the oxide layer in the upper portion is formed.

Therefore, it is possible to form an oxide layer having a uniform thickness by performing an oxidation process to crystallize and form the oxide layer at substantially the same time, while forming the remaining polysilicon thin layer with a uniform thickness. For instance, the remaining polysilicon thin layer is formed to have a thickness ranging from approximately 10 Å to approximately 50 Å.

The oxidation process of the amorphous silicon layer is performed at a temperature ranging from approximately 700° C. to approximately 1,000° C. using a high-temperature low-pressure oxidation method. Also, the oxidation process is performed using a wet, dry, or radical oxidation method.

A wet etch process is performed to remove the oxide layer using the remaining polysilicon thin layer as an etch stop layer. For instance, the wet etch process is performed using hydrogen fluoride (HF) or buffer oxide etchant (BOE), and thus, the remaining polysilicon thin layer is formed to have a thickness ranging from approximately 10 Å to approximately 50 Å over the tunnel dielectric layer 51. Consequently, the charge storage layer 52A having a uniform thickness is formed.

After forming a charge blocking layer 53 and a conducting layer for a gate electrode 54 on the charge capturing layer 52, the conducting layer 54, the charge blocking layer 53 and the charge capturing layer 52 are etched to form the gate pattern including the charge capturing layer 52, the charge blocking layer 53 and the conducting layer 54 that are patterned.

Figure 6:
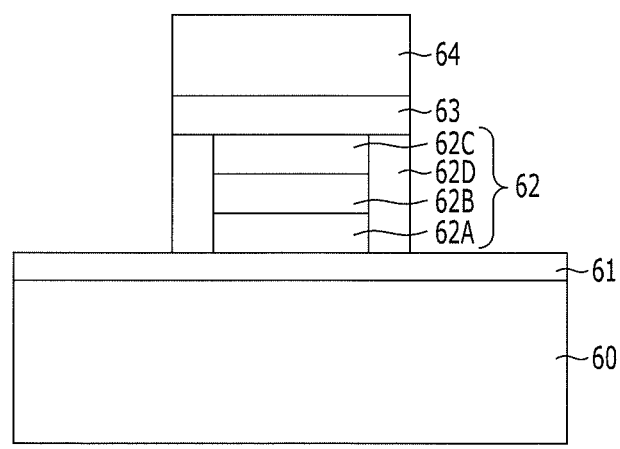
FIG. 6 is a cross-sectional view of a nonvolatile memory device including a gate pattern in accordance with yet another embodiment.

FIG. 6 illustrates a cross-sectional view of a nonvolatile memory device including a gate pattern in accordance with yet another embodiment. Hereinafter, there will be described a process of forming a charge capturing layer 62 including a charge storage layer and a charge trap layer surrounding the charge storage layer and, particularly, a process of forming the charge capturing layer 62 including a charge storage layer 62B, charge trap layers 62A and 62C and an oxide layer 62D, wherein the charge storage layer 62B and the charge trap layers 62A and 62C are alternately stacked and the oxide layer 62D is formed on sidewalls of the charge storage layer 62B and the charge trap layers 62A and 62C. The detailed description of the process is the same as that of FIG. 3.

As shown in FIG. 6, there is formed the gate pattern including the first charge trap layer 62A, the charge storage layer 62B, the second charge trap layer 62C, a charge blocking layer 63 and a gate electrode 64 that are patterned. Although FIG. 6 shows an instance that the first charge trap layer 62A, the charge storage layer 62B and the second charge trap layer 62C are stacked, this is an example embodiment and thus the charge storage layer and the charge trap layer are stacked to have various structures.

Then, through an oxidation process, the oxide layer 62D is formed on the sidewalls of the charge storage layer 62B and the charge trap layers 62A and 62C. At this time, the oxidation process includes a plasma oxidation process or a radical oxidation process.

As a result of the above processes, there is formed the charge capturing layer 62 including the charge storage layer 62B and the charge trap layers 62A and 62C that are alternately stacked, and the oxide layer 62D that is formed on the sidewalls of the charge storage layer 62B and the charge trap layers 62A and 62C. That is, the charge capturing layer 62 is formed with the charge storage layer 62B and the charge trap layers 62A, 62C and 62D surrounding the charge storage layer 62B.

Therefore, it is possible to further reduce the interference effect caused by neighboring cells and the movement of the charges stored in the charge storage layer 62B, which can increase the data erasing speed of the charge trap type non-volatile memory device without the deterioration of the data preserving characteristic.

In other words, in accordance with one or more embodiments, the charge capturing layer is formed as a combination of the charge storage layer and the charge trap layer. In this case, the thickness of the charge trap layer becomes smaller than that in the prior art and the charge storage layer functions as a bridge when charges move, so that the data erasing speed is enhanced.

Further, since the potential barrier at the interface between the charge storage layer and the charge trap layer is increased by the charges trapped in the charge trap layer and thus the vertical and horizontal movement of the charges stored in the charge storage layer can be restricted, the data preserving characteristic is not deteriorated.

Accordingly, it is possible to increase the data erasing speed of the charge trap type nonvolatile memory device without deteriorating the data preserving characteristic. As a result, the degree of integration of the memory device can be enhanced.

FIGS. 7A to 7D are cross-sectional views for explaining a non-volatile memory device and method for fabricating the same in accordance with yet another embodiment. This embodiment relates to a non-volatile memory device having a three-dimensional (3D) structure where a plurality of memory cells are stacked perpendicularly to a substrate, and a fabricating method.

First, a fabrication method of a non-volatile memory device will be described hereinafter.

Figure 7A:
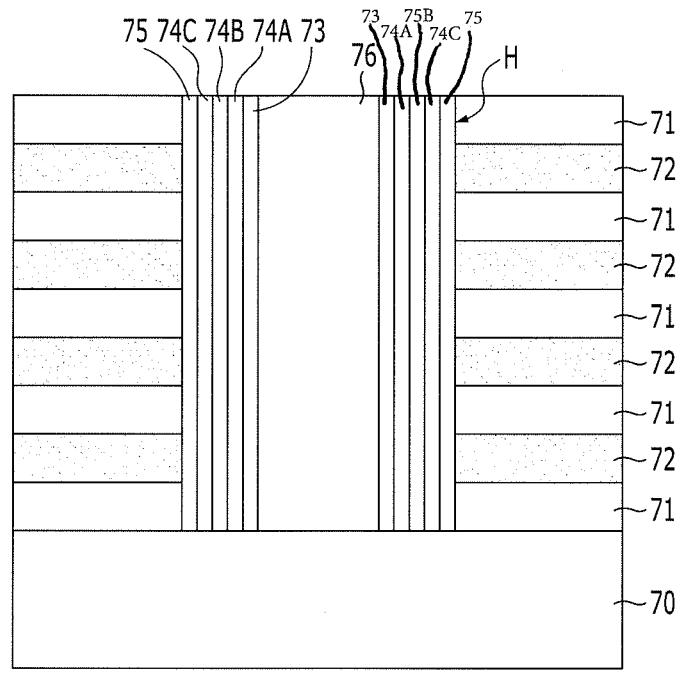
FIGS. 7A to 7D are cross-sectional views for explaining a non-volatile memory device and method for fabricating the same in accordance with yet another embodiment.

Referring to FIG. 7A, a plurality of first sacrificial layers 71 and a plurality of second sacrificial layers 72 are alternately stacked over the substrate 70. The second sacrificial layers 72 provide spaces where gate electrodes of memory cells are to be formed, and the second sacrificial layers 72 are formed of a material having an etching selectivity to the first sacrificial layers 71, such as a nitride. The first sacrificial layers 71 provide spaces where interlayer dielectric layers which insulate gate electrodes of memory cells from each other are to be formed, and the first sacrificial layers 71 are oxide layers.

Then, a channel hole H that penetrates the stacked structure including the first sacrificial layers 71 and the second sacrificial layers 72 and exposes the substrate 70 is formed by selectively etching the stacked structure.

Then, a charge blocking layer 75, a second charge trap layer 74C, a charge storage layer 74B, a first charge trap layer 74A and a tunnel dielectric layer 73 are sequentially formed on a sidewall of the channel hole H.

Then, a channel layer 76 is formed in the channel hole H by filling a remaining space of the channel hole H where the charge blocking layer 75, the second charge trap layer 74C, the charge storage layer 74B, the first charge trap layer 74A and the tunnel dielectric layer 73 are formed with a semiconductor material.

Figure 7B:
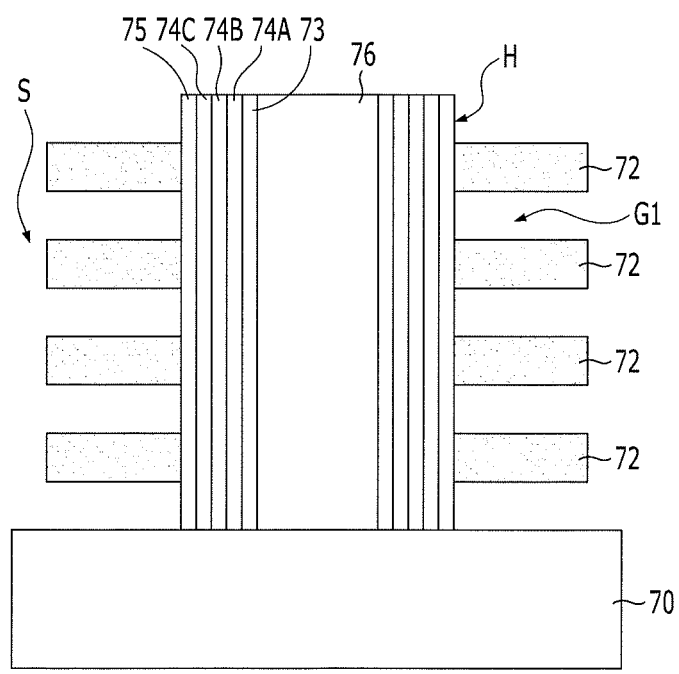

Referring to FIG. 7B, a plurality of slits S that penetrate the stacked structure including the first sacrificial layers 71 and the second sacrificial layers 72 are formed by selectively etching the stacked structure.

Then, the first sacrificial layers 71 exposed by the slits S are removed by a wet etching process or a dry etching process. Hereinafter, a plurality of spaces formed by the removal of the first sacrificial layers 71 will be referred to as a plurality of grooves G1.

Figure 7C:
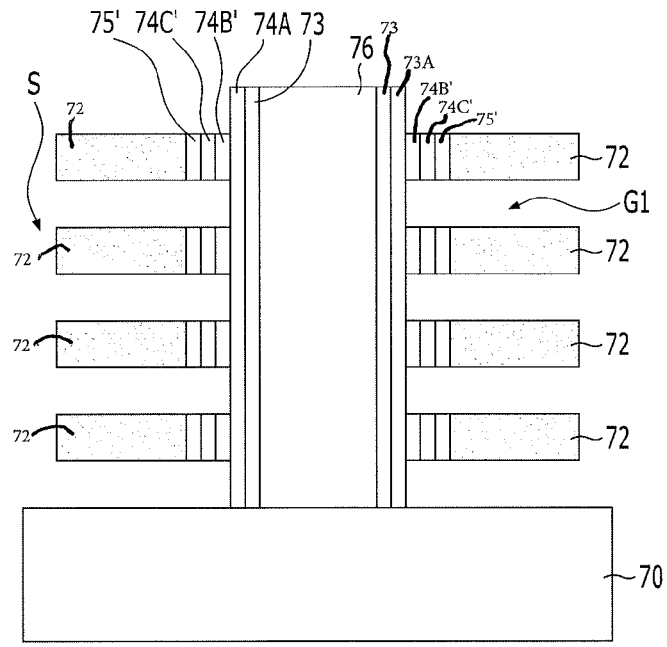

Referring to FIG. 7C, parts of the charge blocking layer 75 exposed by the grooves G1 are removed to form charge blocking patterns 75'. Then, parts of the second charge trap layer 74C exposed by the removal of the charge blocking layer 75 are removed to thereby form second charge trap patterns 74C'. Then, parts of the charge storage layer 74B exposed by the removal of the second charge trap layer 74C are removed to thereby form charge storage patterns 74B'. In this process, the charge storage patterns 74B' of memory cells are separated from each other, thereby preventing charges stored in a memory cell from moving to other adjacent memory cells through the charge storage layer 74B.

The removal of the charge blocking layer 75, the second charge trap layer 74C and the charge storage layer 74B is performed by a wet etching process or a dry etching process using an etching selectivity to the second sacrificial layers 72. When the second charge trap layer 74C and the second sacrificial layers 72 are formed of a same material, such as a nitride, the removal of the second charge trap layer 74C is performed after an oxidation process to the parts of the second charge trap layer 74C is performed so that the parts of the second charge trap layer 74C are changed into an oxynitride.

Meanwhile, although not shown in FIG. 7C, parts of the first charge trap layer 74A exposed by the removal of the parts of the charge storage layer 74B are further removed.

Figure 7D:
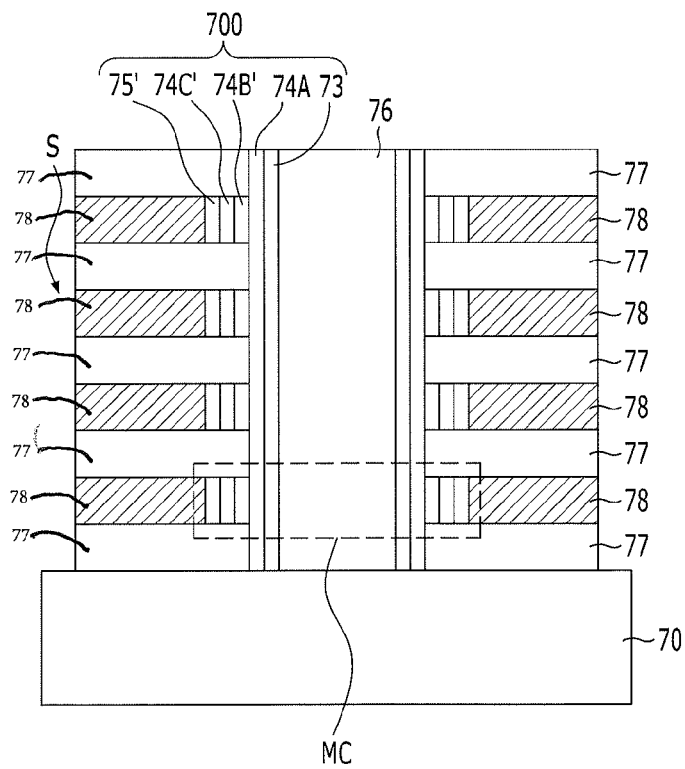

Referring to FIG. 7D, interlayer dielectric layers 77 are formed by filling the grooves G1 with an insulating material such as an oxide.

Then, the second sacrificial layers 72 are substituted with gate electrodes 78 by removing the second sacrificial layers 72 using a wet etching or a dry etching and filling spaces formed by the removal of the second sacrificial layers 72 with a conductive material, such as a metal, a metal nitride, etc.

By the fabrication method described above, the non-volatile memory device of FIG. 7D is fabricated.

Referring again to FIG. 7D, the non-volatile device of the present embodiment includes the channel layer 76 extending from the substrate 70 in a vertical direction and having a pillar shape, a stacked structure where the interlayer dielectric layers 77 and the gate electrodes 78 are alternately stacked along the channel layer 76, and a memory layer 700 interposed between each of the gate electrodes 78 and the channel layer 76. Here, each of a plurality of the memory layers 700 includes the tunnel dielectric layer 73, the first charge trap layer 74A, the charge storage pattern 74B', the second charge trap pattern 74C' and the charge blocking pattern 75'. When viewed from above, the memory layer 700 surrounds the channel layer 76, and the gate electrode 78 surrounds the memory layer 700.

The channel layer 76, each of the gate electrodes 78 surrounding the channel layer 76, and the memory layer 700 interposed between each of the gate electrodes 78 and the channel layer 76 constitute each of memory cells MC. Here, the channel layer 76, the tunnel dielectric layer 73, the first charge trap layer 74A, the charge storage pattern 74B', the second charge trap pattern 74C', the charge blocking pattern 75' and the gate electrode 78 respectively correspond the substrate 30, the tunnel dielectric layer 31, the first charge trap layer 32A, the charge storage layer 32B, the second charge trap layer 32C, the charge blocking layer 33 and the gate electrode 34 of the above disclosed embodiment of FIG. 3, respectively. Therefore, the first charge trap layer 74A and the second charge trap pattern 74C' are formed of an insulating material, and each of the charge storage pattern 74B' is formed of a semiconducting material or a conductive material. Specifically, a band gap size of the charge storage pattern 74B' is smaller than that of the first charge trap layer 74A and the second charge trap pattern 74C'. The charge storage pattern 74B' comprises a conducting layer obtained by doping a semiconducting material layer with p-type impurities or n-type impurities. A doping concentration of the charge storage layer 74B is substantially in a range of 1018 atoms/cm3 to 1021 atoms/cm3. Alternately, the charge storage pattern 74B' comprises one of a polysilicon layer, a germanium layer, a silicon germanium layer and a combination thereof, wherein the silicon germanium layer is a SixGe1−x layer having 0<x<1. The first charge trap layer 74A and the second charge trap pattern 74C' comprise one selected from the group consisting of a silicon nitride layer, an aluminum oxide layer, a zirconium oxide layer, a hafnium oxide layer, a lanthanum oxide layer, a niobium oxide layer and a combination thereof. Alternately, the first charge trap layer 74A and the second charge trap pattern 74C' are formed with a silicon nitride layer, and a ratio of nitride to silicon is substantially in a range of 0.6 to 1.45. Types of charges trapped in the first charge trap layer 74A and the second charge trap pattern 74C', and stored in the charge storage pattern 74B' are same.

In this embodiment, the tunnel dielectric layer 73 and the first charge trap layer 74A extend in the vertical direction, so the tunnel dielectric layer 73 and the first charge trap layer 74A are interposed between the interlayer dielectric layers 77 and the channel layer 76. In contrast, the charge storage pattern 74B', the second charge trap pattern 74C' and the charge blocking pattern 75' exist only between the channel layer 76 and each of the gate electrodes 78, so are not interposed between the interlayer dielectric layers 77 and the channel layer 76. That is, the charge storage pattern 74B', the second charge trap pattern 74C' and the charge blocking pattern 75' included in one memory cell are respectively separated from the charge storage pattern 74B', the second charge trap pattern 74C' and the charge blocking pattern 75' included in another memory cell. Further, Since the charge storage patterns 74B' are separated from each other, movement of charges through the charge storage patterns 74B' between memory cells is prevented.

However, the shapes of the tunnel dielectric layer 73 and the first charge trap layer 74A, the charge storage pattern 74B', the second charge trap pattern 74C' and the charge blocking pattern 75' are not be limited to this embodiment, and are modified in various ways, as long as the memory layer 700 is interposed between each of the gate electrodes 78 and the channel layer 76. For example, instead of the first charge trap layer 74A, first charge trap patterns having a similar shape with the charge storage pattern 74B', the second charge trap pattern 74C' and the charge blocking pattern 75' are formed. Also, the fabricating method of the non-volatile memory device is modified in various ways.

FIGS. 8A to 8D are cross-sectional views for explaining a non-volatile memory device and method for fabricating the same in accordance with yet another embodiment. This embodiment relates to a non-volatile memory device having a three-dimensional (3D) structure and a fabricating method, similar to the embodiment of FIGS. 7A to 7D. When describing this embodiment, some descriptions which are substantially the same as the embodiment of FIGS. 7A to 7D will be omitted.

First, a fabrication method will be described hereinafter.

Figure 8A:
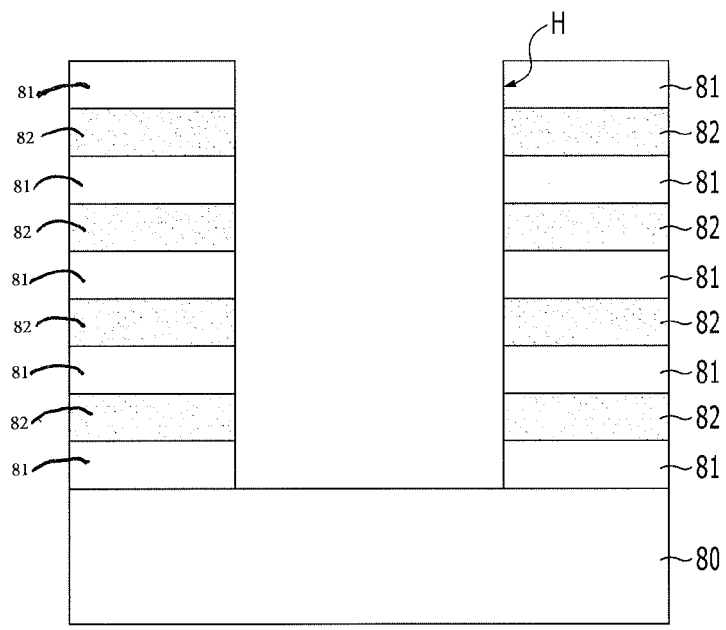
FIGS. 8A to 8D are cross-sectional views for explaining a non-volatile memory device and method for fabricating the same in accordance with yet another embodiment.

Referring to FIG. 8A, a plurality of interlayer dielectric layers 81 and a plurality of sacrificial layers 82 are alternately stacked over the substrate 80. The sacrificial layers 82 provide spaces where gate electrodes of memory cells are to be formed, and the sacrificial layers 82 are formed of a material having an etching selectivity to the interlayer dielectric layers 81, such as a nitride. The interlayer dielectric layers 81 insulate gate electrodes of memory cells from each other, and the interlayer dielectric layers 81 are oxide layers.

Then, a channel hole H that penetrates the stacked structure including the interlayer dielectric layers 81 and the sacrificial layers 82 and exposes the substrate 80 is formed by selectively etching the stacked structure.

Figure 8B:
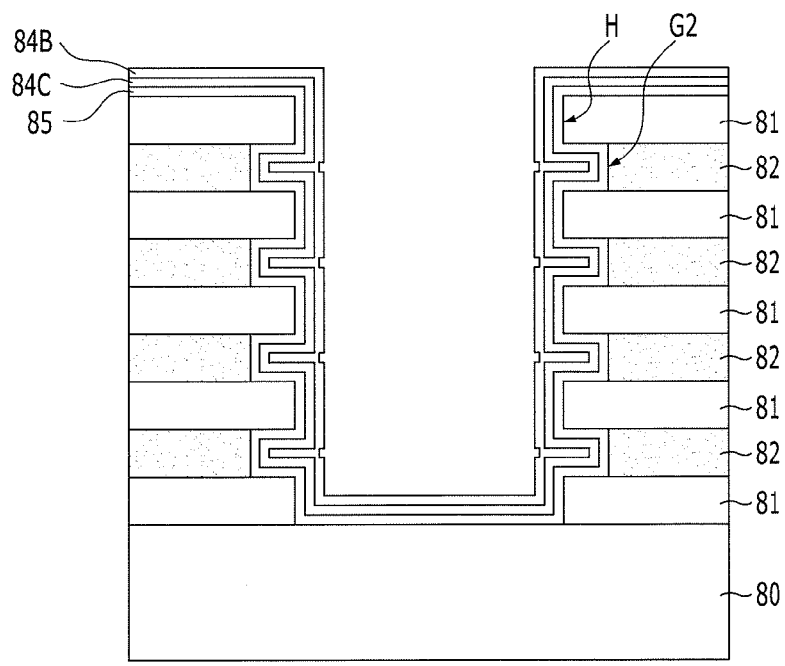

Referring to FIG. 8B, parts of the sacrificial layers 82 exposed by the channel hole H are removed by a wet etching process or a dry etching process. Hereinafter, a plurality of spaces formed by the removal of the parts of the sacrificial layers 82 will be referred to as a plurality of grooves G2.

Then, a charge blocking layer 85, a second charge trap layer 84C, and a charge storage layer 84B are sequentially formed on a resultant structure including the grooves G2 along the underlying profile. In this process, the grooves G2 are filled with the charge blocking layer 85, the second charge trap layer 84C, and the charge storage layer 84B.

Figure 8C:
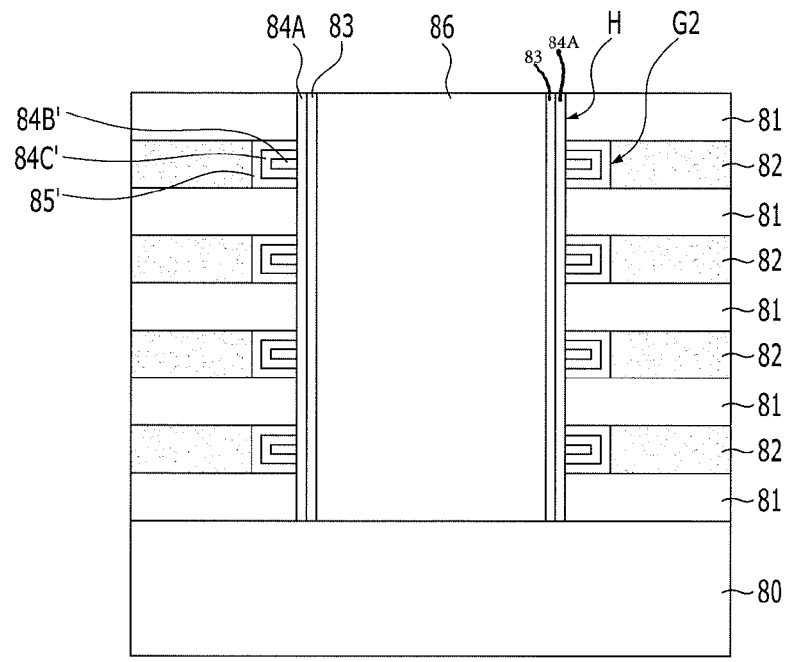

Referring to FIG. 8C, anisotropic etching to the charge blocking layer 85, the second charge trap layer 84C, and the charge storage layer 84B is performed until the charge blocking layer 85, the second charge trap layer 84C, and the charge storage layer 84B which exist on sidewalls of the interlayer dielectric layers 81 are removed. As a result, the charge blocking layer 85, the second charge trap layer 84C, and the charge storage layer 84B remain inside the grooves G2. Hereinafter, the charge blocking layer 85, the second charge trap layer 84C, and the charge storage layer 84B which exist inside each of the grooves G2 are respectively referred to as a charge blocking pattern 85', a second charge trap pattern 84C' and a charge storage pattern 84B'.

Then, a first charge trap layer 84A and a tunnel dielectric layer 83 are sequentially formed on a sidewall of the channel hole H so that the first charge trap layer 84A contacts the charge blocking pattern 85', the second charge trap pattern 84C' and the charge storage pattern 84B'.

Then, a channel layer 86 is formed in the channel hole H by filling a remaining space of the channel hole H where the first charge trap layer 84A and the tunnel dielectric layer 83 are formed with a semiconductor material.

Figure 8D:
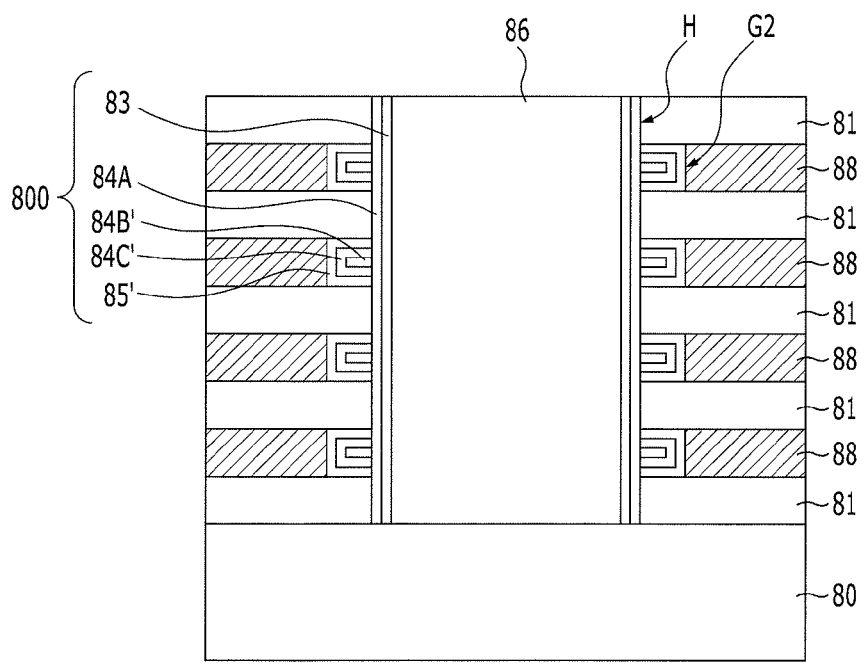

Referring to FIG. 8D, the sacrificial layers 82 are substituted with gate electrodes 88 by removing the sacrificial layers 82 using a wet etching or a dry etching and filling spaces formed by the removal of the sacrificial layers 82 with a conductive material.

By the fabrication method described above, the non-volatile memory device of FIG. 8D is fabricated.

Referring again to FIG. 8D, the non-volatile device of the present embodiment includes the channel layer 86 extending from the substrate 80 in a vertical direction and having a pillar shape, a stacked structure where the interlayer dielectric layers 81 and the gate electrodes 88 are alternately stacked along the channel layer 86, and a memory layer 800 interposed between each of the gate electrodes 88 and the channel layer 86. Here, each of a plurality of the memory layers 800 includes the tunnel dielectric layer 83, the first charge trap layer 84A, the charge storage pattern 84B', the second charge trap pattern 84C' and the charge blocking pattern 85'.

In this embodiment, the tunnel dielectric layer 83 and the first charge trap layer 84A extend in the vertical direction. In contrast, the charge storage pattern 84B', the second charge trap pattern 84C' and the charge blocking pattern 85' exist only between the channel layer 86 and each of the gate electrodes 88. Further, one sidewall of each of the charge storage pattern 84B', the second charge trap pattern 84C' and the charge blocking pattern 85' contacts the first charge trap layer 84A. In this case, the second charge trap pattern 84C' surrounds upper and lower surfaces and the other sidewall of the charge storage pattern 84B'. Also, the charge blocking pattern 85' surrounds upper and lower surfaces and the other sidewall of the second charge trap pattern 84C'.

FIGS. 9A to 9D are cross-sectional views for a non-volatile memory device and method for fabricating the same in accordance with yet another embodiment. This embodiment relates to a non-volatile memory device having a three-dimensional (3D) structure and a fabricating method, similar to the embodiment of FIGS. 7A to 7D. When describing this embodiment, some descriptions which are substantially the same as the embodiment of FIGS. 7A to 7D will be omitted.

First, a fabrication method will be described hereinafter.

Figure 9A:
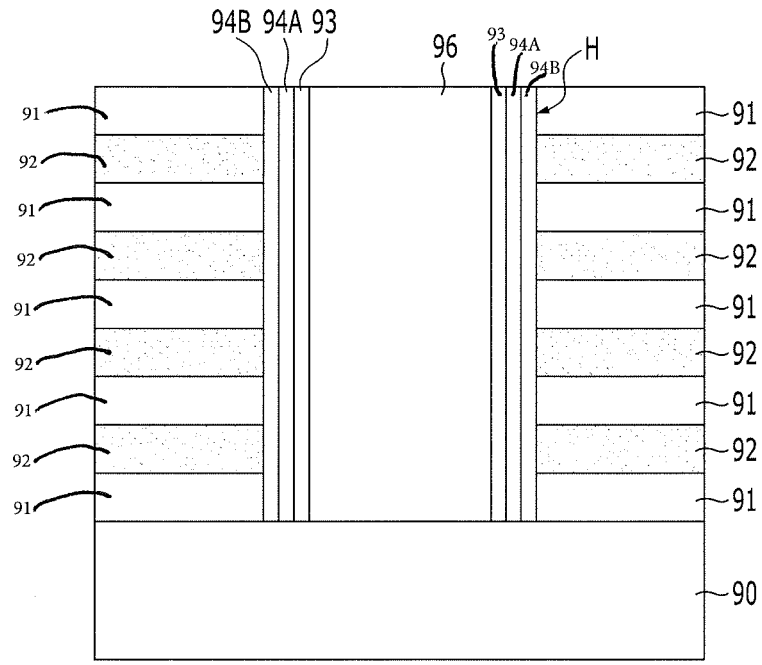
FIGS. 9A to 9D are cross-sectional views for explaining a non-volatile memory device and method for fabricating the same in accordance with yet another embodiment.

Referring to FIG. 9A, a plurality of first sacrificial layers 91 and a plurality of second sacrificial layers 92 are alternately stacked over the substrate 90.

Then, a channel hole H that penetrates the stacked structure including the first sacrificial layers 91 and the second sacrificial layers 92 is formed.

Then, a charge storage layer 94B, a first charge trap layer 94A and a tunnel dielectric layer 93 are sequentially formed on a sidewall of the channel hole H.

Then, a channel layer 96 is formed in the channel hole H where the charge storage layer 94B, the first charge trap layer 94A and the tunnel dielectric layer 93 are formed.

Figure 9B:
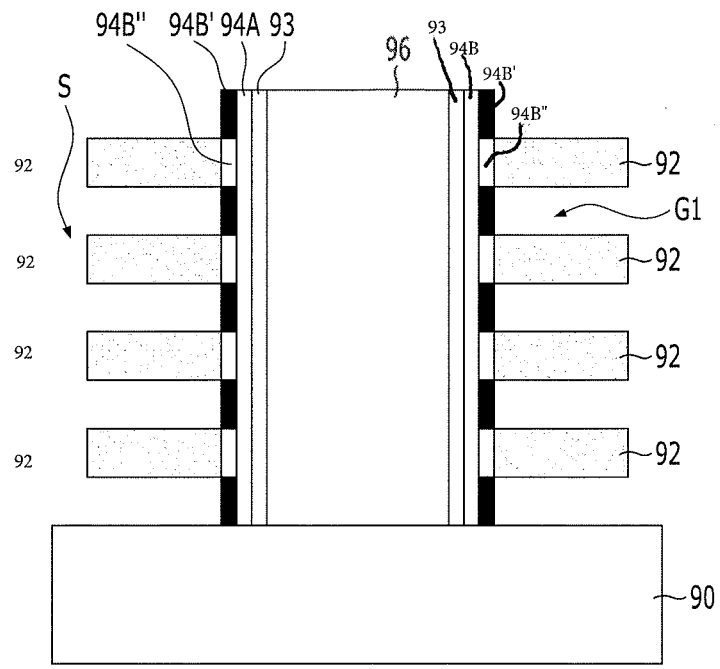

Referring to FIG. 9B, one or more slits S that penetrate the stacked structure including the first sacrificial layers 91 and the second sacrificial layers 92 are formed.

Then, the first sacrificial layers 91 exposed by the slits S are removed to thereby form one or more grooves G1.

Then, parts of the charge storage layer 94B exposed by the grooves G1 are oxidized so that the parts of the charge storage layer 94B are changed into oxidized layers 94B'. The oxidized layers 94B' includes an oxide of a material for the charge storage layer 94B. Remaining portions of the charge storage layer 94B which are not oxidized are referred to as charge storage patterns 94B". In this process, the charge storage patterns 94B" of memory cells are separated from each other by the oxidized layers 94B' which are interposed between the charge storage patterns 94B" in a vertical direction. Although not shown, in an alternative embodiment, the parts of the charge storage layer 94B exposed by the grooves G1 is removed instead of being oxidized to thereby form the charge storage patterns 94B".

Figure 9C:
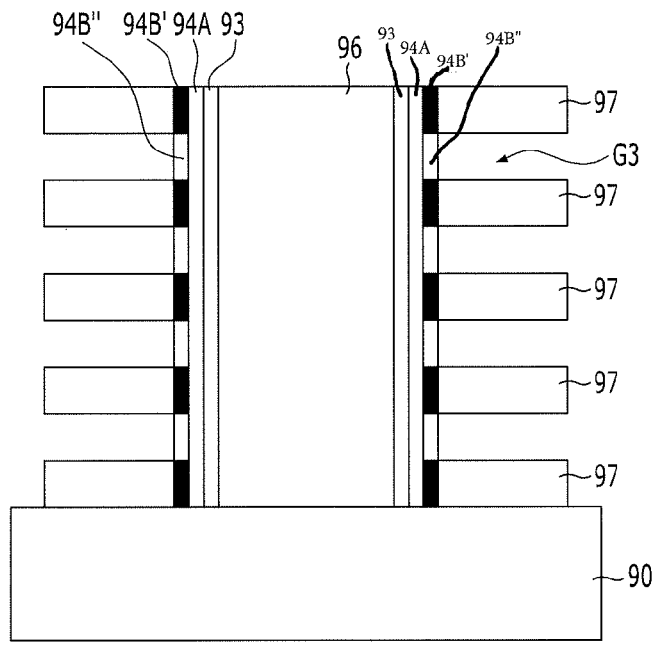

Referring to FIG. 9C, interlayer dielectric layers 97 are formed by filling the grooves G1 with an insulating material.

Then, the second sacrificial layers 92 are removed to thereby form one or more grooves G3.

Figure 9D:
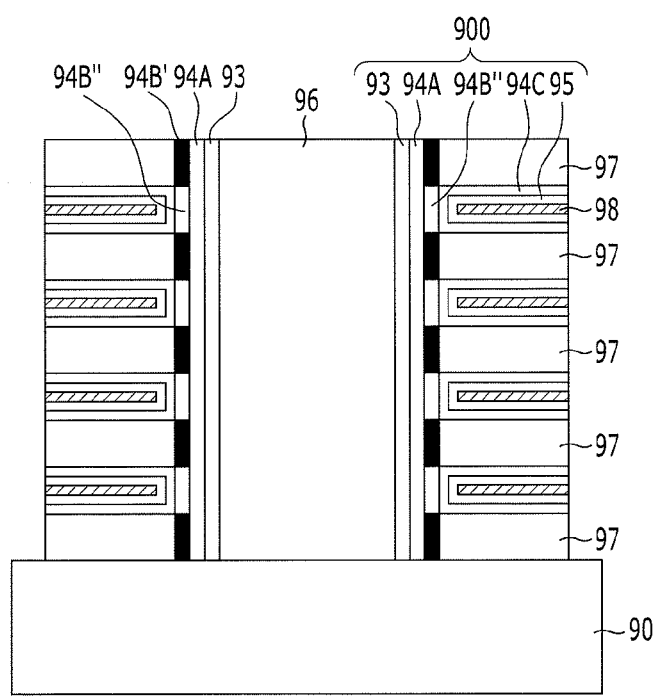

Referring to FIG. 9D, a second charge trap layer 94C, a charge blocking layer 95, and a gate electrode 98 are formed in each of the grooves G3 by sequentially forming a charge trap material, a charge blocking material and a conductive material on a resultant structure including the grooves G3 along the underlying profile, and performing anisotropic etching to the charge trap material, the charge blocking material and the conductive material.

By the fabrication method described above, the non-volatile memory device of FIG. 9D is fabricated.

Referring again to FIG. 9D, the non-volatile device of the present embodiment includes the channel layer 96 extending from the substrate 90 in a vertical direction and having a pillar shape, a stacked structure where the interlayer dielectric layers 97 and the gate electrodes 98 are alternately stacked along the channel layer 96, and a memory layer 900 interposed between each of the gate electrodes 98 and the channel layer 96. Here, each of a plurality of the memory layers 900 includes the tunnel dielectric layer 93, the first charge trap layer 94A, the charge storage pattern 94B", the second charge trap layer 94C and the charge blocking layer 95.

In this embodiment, the tunnel dielectric layer 93 and the first charge trap layer 94A extend in the vertical direction. In contrast, the charge storage pattern 94B", the second charge trap layer 94C and the charge blocking layer 95 exist between the channel layer 96 and each of the gate electrodes 98, and are not interposed between the interlayer dielectric layers 97 and the channel layer 96. Further, one charge storage pattern 94B" is separated from adjacent charge storage pattern 94B" in the vertical direction by the oxidized layer 94B' interposed between one charge storage pattern 94B" and another adjacent charge storage pattern 94B". Each of the second charge trap layer 94C has one sidewall which contacts the charge storage pattern 94B" and surrounds upper and lower surfaces and one sidewall respectively facing the charge blocking layer 95. The charge blocking layer 95 surrounds upper and lower surfaces and one sidewall respectively facing the gate electrode 98.

Although exemplary embodiments of the present disclosure have been described for illustrative purposes, those skilled in the art will appreciate that various modifications, additions and substitutions are possible, without departing from the various characteristics of the disclosure. That is, it is understood that the present disclosure should not be limited to these embodiments but various changes and modifications can be made by one ordinarily skilled in the art within the subject matter, the spirit and scope of the present disclosure as hereinafter claimed. Specific terms used in this disclosure and drawings are used for illustrative purposes and not to be considered as limitations of the present disclosure. Exemplary embodiments of the present disclosure have not been described for limiting purposes. Accordingly, the scope of the claimed invention is not to be limited by the above embodiments but by the claims and the equivalents thereof.

What is claimed is:

1. A non-volatile memory device, comprising:
a channel layer that extends from a substrate in a vertical direction;
a plurality of interlayer dielectric layers and a plurality of gate electrodes that are alternately stacked along the channel layer; and
a memory layer that is interposed between the channel layer and each of the gate electrodes,
wherein the memory layer comprises, between the channel layer and each of the gate electrodes:
a tunnel dielectric layer contacting the channel layer,
a charge blocking layer contacting the gate electrode,
a first charge trap layer contacting the tunnel dielectric layer and formed of an insulating material,
a second charge trap layer contacting the charge blocking layer and formed of an insulating material, and
a charge storage layer interposed between the first charge trap layer and the second charge trap layer, and formed of a semiconducting material or a conductive material.

2. The nonvolatile memory device of claim 1, wherein one charge storage layer interposed between one gate electrode and the channel layer and another charge storage layer interposed between another gate electrode and the channel layer are separated from each other.

3. The nonvolatile memory device of claim 1, wherein the tunnel dielectric layer extends in the vertical direction along the channel layer.

4. The nonvolatile memory device of claim 1, wherein one second charge trap layer interposed between one gate electrode and the channel layer and another second charge trap layer interposed between another gate electrode and the channel layer are separated from each other.

5. The nonvolatile memory device of claim 1, wherein one charge blocking layer interposed between one gate electrode and the channel layer and another charge blocking layer interposed between another gate electrode and the channel layer are separated from each other.

6. The nonvolatile memory device of claim 1, one sidewall of each of the charge storage layer, the second charge trap layer and the charge blocking layer contacts the first charge trap layer,
the second charge trap layer surrounds upper and lower surfaces and the other sidewall of the charge storage layer, and
the charge blocking layer surrounds upper and lower surfaces and the other sidewall of the second charge trap layer.

7. The nonvolatile memory device of claim 1, one sidewall of each of the second charge trap layer, the charge blocking layer and the corresponding gate electrode faces the channel layer,
the second charge trap layer contacts the charge storage layer and surrounds upper and lower surfaces and one sidewall of the charge blocking layer, and
the charge blocking layer surrounds upper and lower surfaces and one sidewall of the gate electrode.

8. The nonvolatile memory device of claim 1, further comprising:
a layer interposed between one charge storage layer and another charge storage layer adjacent to the one charge storage layer in the vertical direction, said layer formed of an oxide of the semiconducting material or an oxide of the conducting material.

9. The nonvolatile memory device of claim 1, wherein a band gap size of the charge storage layer is smaller than that of the first and second charge trap layers.

10. The nonvolatile memory device of claim 1, wherein the charge storage layer comprises a conductive layer, the conductive layer comprising a semiconducting material layer doped with p-type impurities or n-type impurities.

11. The nonvolatile memory device of claim 10, wherein a doping concentration of the impurities in the charge storage layer is in a range of $1E18$ atoms/cm$^3$ to $1E21$ atoms/cm$^3$.

12. The nonvolatile memory device of claim 1, wherein the charge storage layer comprises one selected from the group consisting of a polysilicon layer, a germanium layer, a silicon germanium layer and a combination thereof, wherein the silicon germanium layer is a $SixGe1-x$ layer having $0<x<1$.

13. The nonvolatile memory device of claim 1, wherein at least one of the first and second charge trap layers comprises at least one selected from the group consisting of a silicon nitride layer, an aluminum oxide layer, a zirconium oxide layer, a hafnium oxide layer, a lanthanum oxide layer, and a niobium oxide layer.

14. The nonvolatile memory device of claim 1, wherein at least one of the first and second charge trap layers is formed with a silicon nitride layer, and a ratio of nitride to silicon in the silicon nitride layer is in a range of 0.6 to 1.45.

15. The nonvolatile memory device of claim 1, wherein the first and the second charge trap layers and the charge storage layer are configured to respectively trap and store charges of the same type.

16. A non-volatile memory device, comprising:
a channel layer that extends from a substrate in a vertical direction;
a plurality of interlayer dielectric layers and a plurality of gate electrodes that are alternately stacked along the channel layer;
a tunnel dielectric layer interposed between the channel layer and a first charge trap layer, and extending in the vertical direction;
the first charge trap layer interposed between the tunnel dielectric layer and charge storage layers and formed of an insulating material, wherein the first charge trap layer extends in the vertical direction;
the charge storage layers interposed between the first charge trap layer and second charge trap layers and formed of a semiconducting material or a conductive material, wherein the charge storage layers face the corresponding gate electrodes and are separated from each other;
the second charge trap layers interposed between the corresponding charge storage layers and corresponding charge blocking layers and formed of an insulating material, wherein the second charge trap layers are separated from each other; and
the charge blocking layers interposed between the corresponding second charge trap layers and the corresponding gate electrodes, wherein the charge blocking layers are separated from each other.

17. The nonvolatile memory device of claim 16, wherein one sidewall of each of the charge storage layers, the second charge trap layers and the charge blocking layers contacts the first charge trap layer,
- each of the second charge trap layers surrounds upper and lower surfaces and the other sidewall of the corresponding charge storage layer, and
- each of the charge blocking layers surrounds upper and lower surfaces and the other sidewall of the corresponding second charge trap layer.

18. The nonvolatile memory device of claim 16, wherein one sidewall of each of the second charge trap layers, the charge blocking layers and the gate electrodes faces the channel layer,
- each of the second charge trap layers surrounds upper and lower surfaces and one sidewall of the corresponding charge blocking layer, and
- each of the charge blocking layers surrounds upper and lower surfaces and one sidewall of the corresponding gate electrode.

19. The nonvolatile memory device of claim 16, further comprising:
- a layer interposed between two charge storage layers which are adjacent in the vertical direction, said layer formed of an oxide of the semiconducting material or an oxide of the conducting material.

* * * * *